United States Patent
Kyung

(10) Patent No.: US 7,477,067 B2
(45) Date of Patent: Jan. 13, 2009

(54) SEMICONDUCTOR INTEGRATED CIRCUIT WHICH CAN BE BURN-IN-TESTED EVEN WHEN PACKAGED AND METHOD OF BURN-IN-TESTING SEMICONDUCTOR INTEGRATED CIRCUIT EVEN WHEN THE SEMICONDUCTOR INTEGRATED CIRCUIT IS PACKAGED

(75) Inventor: Kye-hyun Kyung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/498,928

(22) Filed: Aug. 3, 2006

(65) Prior Publication Data

US 2007/0035320 A1 Feb. 15, 2007

(30) Foreign Application Priority Data

Aug. 11, 2005 (KR) ...................... 10-2005-0073729

(51) Int. Cl.
*G01R 31/02* (2006.01)
*G01R 31/26* (2006.01)

(52) U.S. Cl. ...................... 324/763; 324/765

(58) Field of Classification Search ................ 324/760, 324/763–765; 365/201
See application file for complete search history.

(56) References Cited

U.S. PATENT DOCUMENTS

| 5,642,057 | A | * | 6/1997 | Oke et al. ................... 324/763 |
| 5,933,434 | A | * | 8/1999 | Roohparvar ................. 714/718 |
| 6,239,603 | B1 | * | 5/2001 | Ukei et al. .................. 324/763 |
| 6,327,198 | B1 | | 12/2001 | Kato et al. |
| 6,518,746 | B2 | * | 2/2003 | McClure .................. 324/158.1 |
| 6,832,348 | B2 | | 12/2004 | Kawabe et al. |
| 6,963,212 | B2 | * | 11/2005 | Brown ........................ 324/763 |
| 7,245,140 | B2 | * | 7/2007 | Sunwoo et al. .............. 324/765 |
| 2005/0104611 | A1 | * | 5/2005 | Hong et al. ................. 324/760 |
| 2005/0134300 | A1 | * | 6/2005 | Kushiyama et al. ......... 324/763 |
| 2005/0212542 | A1 | * | 9/2005 | Brown ........................ 324/763 |

FOREIGN PATENT DOCUMENTS

| JP | 2001-014892 | 1/2001 |
| JP | 2001-166003 | 6/2001 |
| KR | 100238866 B1 | 10/1999 |

* cited by examiner

*Primary Examiner*—Ha Tran T Nguyen
*Assistant Examiner*—J. B.
(74) *Attorney, Agent, or Firm*—Mills & Onello, LLP

(57) ABSTRACT

A semiconductor integrated circuit and method for burn-in-testing are provided that uniformly apply stress to elements of the semiconductor integrated circuit in a burn-in test mode, even when packaged. The semiconductor integrated circuit may include a transmission control unit that transmits an operation signal in a normal operating mode and blocks the operation signal in the test mode; and a test control unit that sequentially outputs a first signal and a second signal to an input/output (I/O) circuit in the test mode.

18 Claims, 1 Drawing Sheet

SEMICONDUCTOR INTEGRATED CIRCUIT WHICH CAN BE BURN-IN-TESTED EVEN WHEN PACKAGED AND METHOD OF BURN-IN-TESTING SEMICONDUCTOR INTEGRATED CIRCUIT EVEN WHEN THE SEMICONDUCTOR INTEGRATED CIRCUIT IS PACKAGED

This application claims priority to Korean Patent Application No. 10-2005-0073729, filed on Aug. 11, 2005, in the Korean Intellectual Property Office, the disclosure of which is incorporated herein in its entirety by reference.

BACKGROUND OF THE INVENTION

1. Field of the Invention

The present invention relates to a semiconductor integrated circuit and a method of testing a semiconductor integrated circuit, and more particularly, to a semiconductor integrated circuit which can be burn-in-tested even when packaged and a method of burn-in-testing a semiconductor integrated circuit even when the semiconductor integrated circuit is packaged.

2. Description of the Related Art

In general, it takes a considerable amount of time to test the lifetime of semiconductor memory devices in an actual operating environment. Thus, it is necessary to reduce the test time while providing precise test results. To meet this necessity, burn-in tests are widely used.

In burn-in tests, products are tested under poorer conditions than in an actual operating environment by applying excessive stress within a short period of time. Memory vendors sell products that have passed such burn-in tests, and can thus guarantee predetermined lifetime when driven in an actual operating environment.

In order to enhance the efficiency of burn-in tests, a wafer burn-in test method has been adopted. The wafer burn-in test method involves performing tests in read and write operations, as well as performing direct current (DC) tests, to efficiently screen out defective chips. Such chips may include devices such as memory devices, that are to be tested.

FIG. 1 is a block diagram of a conventional wafer burn-in apparatus. Referring to FIG. 1, a plurality of chips on a wafer are divided into a plurality of dies by scribe lines (not shown), and each of the chips includes a wafer burn-in test circuit 10 and a plurality of dummy pads 20 for applying various power supply voltages needed for a burn-in test, and also includes the semiconductor devices to be tested.

The wafer burn-in test circuit 10 receives a signal WBE and generates a test master signal. In order to stably provide direct current (DC) power supply voltages required for a burn-in test, power supply voltages VPP, VBB, VBL, and VP are input from one or more sources external to the wafer burn-in apparatus via the dummy pads 20. In addition, the wafer burn-in test circuit 10 receives an address signal via an address pad (not shown) and performs a burn-in operation compatible with each test mode.

However, once the chip is packaged, the dummy pads 20 cannot be connected to an external device, and thus, the wafer burn-in test circuit 10 cannot be burn-in-tested. Therefore, research has been vigorously conducted to develop semiconductor integrated chips which can be burn-in-tested even after packaged. U.S. Pat. No. 5,471,429 discloses semiconductor devices which can be burn-in-tested even when packaged.

In the case of burn-in-testing input/output (I/O) circuits inside a semiconductor integrated circuit after packaging the semiconductor integrated circuit, a burn-in test apparatus may consume a considerable amount of current. For example, the current consumption of a delay locked loop (DLL), which is a type of I/O circuit that can be included in a semiconductor integrated circuit, may considerably increase when the DLL operates in a test mode. In a static burn-in test, nodes of a DLL are respectively fixed either to a power supply voltage or to a ground voltage, and thus, static stress may not be uniformly applied to all elements of a semiconductor integrated circuit.

FIG. 2 is a circuit diagram of an I/O circuit 200 comprising a plurality of nodes N1 through Nm. Referring to FIG. 2, in the I/O circuit 200, a plurality of first through m-th inverters, designated as I1 through Im, are connected in series. If an operation signal OPS having a logic high level is applied to the I/O circuit 200 when the I/O circuit 200 is burn-in-tested, the first node N1 is fixed to a low voltage level, the second node is fixed to a high voltage level, and the third node N3 is fixed to the low voltage level and so on. The m-th node Nm is fixed either to the high voltage level or to the low voltage level, depending on the level of its input.

Each of the inverters I1 through Im comprises a Positive Metal-Oxide Semiconductor (PMOS) transistor and a Negative Metal-Oxide Semiconductor (NMOS) transistor that are connected in series. When the first node N1 is fixed to the low voltage level during a burn-in test, the PMOS transistor of the second inverter I2 is turned on so that stress can be applied to that PMOS transistor. But the NMOS transistor of the second inverter I2 is turned off so that stress cannot be applied to the NMOS transistor. In the same manner, stress is applied to either the PMOS transistor or the NMOS transistor in each of the inverters I1 through Im, according to the voltage of the corresponding node. Therefore, in a static burn-in test mode, all elements of a packaged semiconductor integrated circuit may not be properly tested.

SUMMARY OF THE INVENTION

In accordance with one aspect of the present disclosure, provided is a semiconductor integrated circuit whose elements can be burn-in-tested even when the semiconductor integrated circuit is packaged.

In accordance with another aspect of the present disclosure, provided is a method of burn-in-testing a semiconductor integrated circuit in which all elements of the semiconductor integrated circuit can be burn-in-tested even when the semiconductor integrated circuit is packaged.

According to an aspect of the present disclosure, there may be provided a semiconductor integrated circuit comprising a transmission control unit configured to output an operation signal if the semiconductor IC is in a normal operating mode and to block output of the operation signal if the semiconductor IC is in a test mode. The semiconductor IC also includes a test control unit operatively coupled to the transmission control unit and configured to output a first signal and a second signal in the test mode and an input/output (I/O) circuit operatively coupled to the test control unit and configured to receive the first and second signals in the test mode.

The first signal and second signal can be output sequentially.

In the semiconductor IC, the test control unit can generate the first signal for a predetermined amount of time during the test mode and generate the second signal during the rest of the test mode. The semiconductor IC can include a control node configured to receive the operation signal from the transmission control unit in the normal operating mode and configured to output the first and second signals to the I/O circuit in the test mode.

The transmission control unit can comprise a transmission gate configured to be turned on and to transmit the operation signal to the control node in response to a first control signal in the normal operating mode and also configured to be turned off and to block the output of the operation signal to the control node in the test mode. The first control signal can be generated through a mode register set (MRS).

The test control unit can further comprise: a first transistor coupled between a first voltage and the control node and configured to generate the first signal in response to a second control signal; and a second transistor coupled between the control node and a second voltage and configured to generate the second signal in response to a third control signal, wherein, in the test mode, the first and second transistors are alternately turned on. The second and third control signals can be generated through a mode register set (MRS), the first voltage can be a power supply voltage, and the second voltage can be a ground voltage.

The semiconductor IC can be disposed in a package and the test mode can be a package burn-in test mode. The I/O circuit can be a delay locked loop (DLL). The first and second signals can have opposite levels. For example, the first signal can be a high level signal and the second signal can be a low level signal.

In accordance with another aspect of the disclosure, provide can be a semiconductor IC comprising an I/O circuit including a set of elements to be tested and a test unit operatively coupled to the I/O circuit and, when in a test mode, configured to block an operation signal directed to the I/O circuit, to apply a first signal to the I/O circuit for a predetermined amount of time, and to apply a second signal to the I/O circuit.

The first and second signals can have opposite levels. The first signal can be a high level signal and the second signal can be a low level signal.

The test unit can comprise a transmission gate which controls the transmission of the operation signal in response to a first control signal; a first transistor coupled between a first voltage and the I/O circuit and configured to transmit the first signal to the I/O circuit in response to a second control signal; and a second transistor coupled between a second voltage and the I/O circuit and configured to transmit the second signal to the I/O circuit in response to a third control signal. The first, second, and third control signals can be generated through a mode register set (MRS). The test mode can be a package burn-in test mode. The I/O circuit can be a DLL.

In accordance with another aspect of the present disclosure, provide can be method of testing a semiconductor integrated circuit (IC) comprising an I/O circuit. The method can comprise, in a test mode, maintaining the voltages of a plurality of nodes of the I/O circuit at a high level or a low level and switching the voltages of the nodes.

The test mode can be a package burn-in test mode.

In accordance with another aspect of the present disclosure can be another method of testing a semiconductor integrated circuit (IC). The method can comprise, in a test mode, blocking output of an operation signal to an input/output (I/O) circuit including a set of elements to be tested and outputting a set of test signals to the I/O circuit to test substantially all of the set of elements.

The set of test signals can include a first signal and a second signal having opposite levels. The semiconductor IC can be a packaged semiconductor IC and the test mode can be a burn-in test mode. The first signal and the second signal, can be output sequentially.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
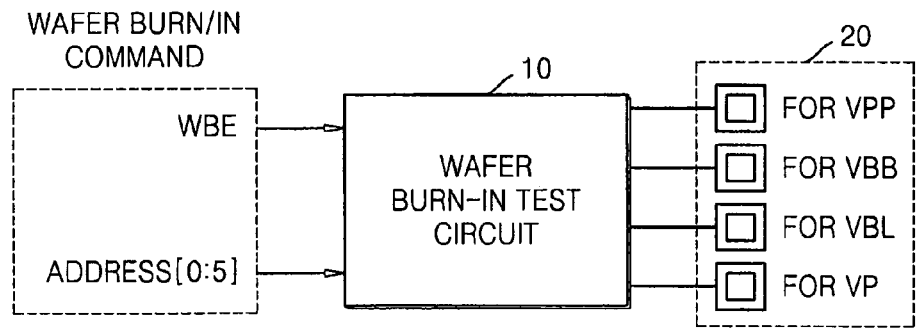
FIG. 1 is a block diagram of a conventional wafer burn-in test apparatus.
Figure 2:
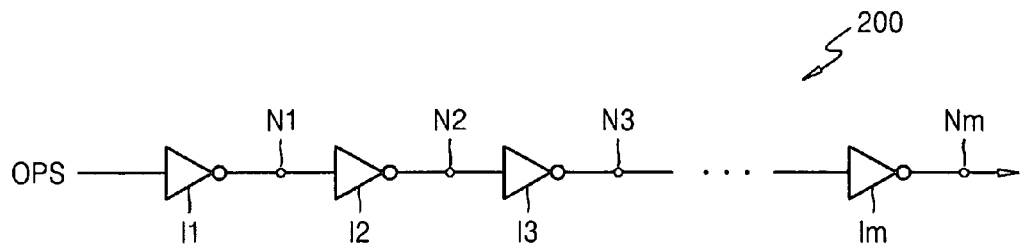
FIG. 2 is a circuit diagram of a typical I/O circuit comprising a plurality of nodes.

The present invention will now be described more fully with reference to the accompanying drawings in which exemplary embodiments of the invention are shown. In the drawings, like reference numerals represent like elements.

It will be understood that, although the terms first, second, etc. may be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular. embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Figure 3:
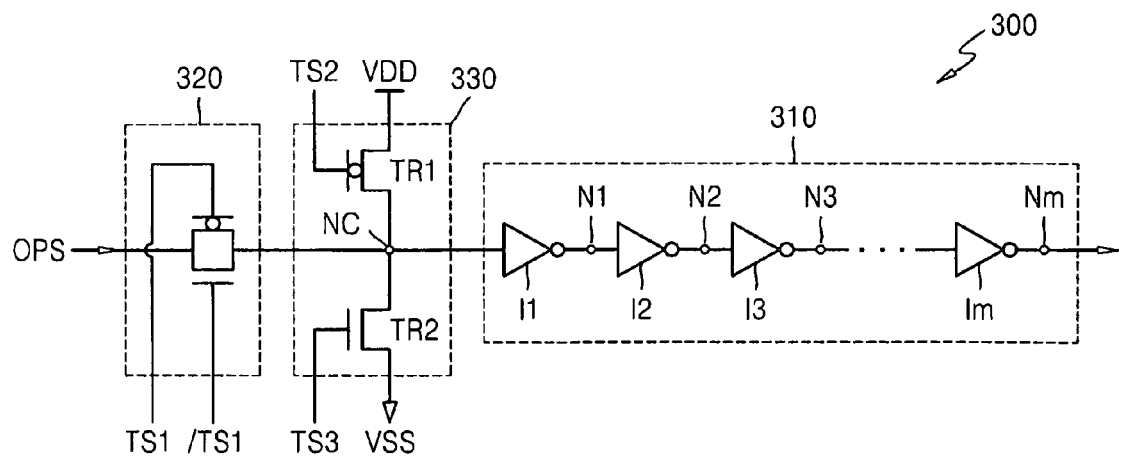
FIG. 3 is a circuit diagram of a semiconductor integrated circuit according to an exemplary embodiment of the present invention.

FIG. 3 is a circuit diagram of a semiconductor integrated circuit 300 according to an exemplary embodiment of the present invention. Referring to FIG. 3, the semiconductor integrated circuit 300 includes an I/O circuit 310, a transmission control unit 320, and a test control unit 330.

The transmission control unit 320 applies an operation signal OPS to a control node NC of the I/O circuit 310, or blocks the operation signal OPS based on whether a current operating mode of the semiconductor integrated circuit is a normal operating mode or a test mode. The test control unit 330 transmits a set of signals, e.g., a first signal and then a second signal, to the control node NC in a test mode. As an example, the test control unit 330 can transmit to the control node NC a high level first signal and then a low level second signal.

The semiconductor integrated circuit 300 solves the problem of conventional burn-in test apparatuses, wherein stress may not be uniformly applied to all elements of a packaged semiconductor integrated circuit when the semiconductor integrated circuit is burn-in-tested, e.g., when using a mode register set (MRS). MRSs are known in the art, so not shown or discussed herein.

In other words, in the present embodiment, it is possible to uniformly apply a substantially static stress to substantially all circuits (or elements) to be tested by applying a test signal having a logic high level to the circuits to be tested for a predetermined period of time in a burn-in test mode and then applying a test signal having a logic low level to the circuits to be tested for another predetermined period of time in the burn-in test mode.

The I/O circuit 310 is a circuit for controlling the inputting and outputting of signals to and from the semiconductor integrated circuit 300. The I/O circuit 310 may be implemented as a delay locked loop (DLL). A DLL can be comprised of various circuits, such as a phase detector and a delay line. Since elements of a DLL, such as a phase detector and a delay line, are connected to one another by nodes, the I/O circuit 310 may be illustrated in FIG. 3 as a series of inverters I1 through Im, as one illustrative embodiment.

The transmission control unit 320 may be implemented as a transmission gate which is turned on in a normal operating mode in response to a first control signal TS1 and thus applies the operation signal OPS to the control node NC. The transmission gate may be turned off in a test mode and, as a result, blocks the operation signal OPS from being output to the test control unit 330, which prevents it from being applied to the control node NC.

In the embodiment of FIG. 3, the first control signal TS1 is applied to the gate of a PMOS transistor of the transmission gate, and an inverted form of the first control signal TS1, designated as TS1', is applied to the gate of an NMOS transistor of the transmission gate. The first control signal TS1 is generated through the MRS.

In this embodiment, in the normal operating mode, the first control signal TS1 is logic low. Then, the transmission gate is turned on, and the I/O circuit 310 begins to operate. In the test mode, the first control signal TS1 is logic high. Then, the transmission gate is turned off, thus blocking the operation signal OPS from being output to the test control unit 330.

Here, in this embodiment, the test mode is a package burn-in test mode. And the first control signal TS1 is illustrated in FIG. 3 as being applied to the PMOS transistor of the transmission gate. But in other embodiments TS1 may be applied to a different transistor of the transmission gate.

Continuing with the embodiment of FIG. 3, the test control unit 330 generates the first signal for a predetermined period of time in the test mode and generates the second signal for another predetermined period of time in the test mode. Here, the first signal may be a high level signal, and the second signal may be a low level signal.

In this embodiment, the test control unit 330 includes a first transistor TR1 and a second transistor TR2. The first transistor TR1 is connected between a first voltage VDD and the control node NC and generates the first signal in response to a second control signal TS2. The second transistor TR2 is connected between the control node NC and a second voltage VSS and generates the second signal in response to a third control signal TS3. Here, the first voltage VDD may be a power supply voltage, and the second voltage VSS may be a ground voltage.

In other words, when the operating mode of the semiconductor integrated circuit 300 is switched to a burn-in test mode, the first transistor TR1 is turned on in response to the second control signal TS2 for a predetermined amount of time in the burn-in test mode. Then, a current flows from the first voltage VDD to the control node NC and thus generates the first signal. The voltage of the control node NC reaches the high level.

When the voltage of the control node NC is at a high level, the voltage of the first node N1 reaches a low level, the voltage of the second node N2 reaches the high level, and the voltage of the third node N3 reaches the low level. If the m-th inverter is an even-numbered inverter, then the voltage of the m-th node Nm reaches the high level.

In the burn-in test mode, the second transistor TR2 is turned on in response to the third control signal TS3, after the predetermined amount of time that the first signal is applied to the I/O circuit. Then, a current flows from the second voltage VSS to the control node NC and thus generates the second signal.

In this embodiment, since the second voltage VSS is a ground voltage, a current flows from the control node to the second voltage VSS, and the voltage of the control node NC reaches the low level. Then, the first transistor TR1 is turned off in response to the first control signal TS1.

Since the voltage of the control node NC is at the low level, the voltage of the first node N1 reaches the high level, the voltage of the second node N2 reaches the low level, and the voltage of the third node N3 reaches the high level. If the m-th inverter Im is an even-numbered inverter, then the voltage of the m-th node Nm reaches the low level.

In the present embodiment, unlike in the prior art, each of the first through m-th nodes N1 through NM experiences both the high level and the low level during the burn-in test mode. Therefore, a PMOS transistor and an NMOS transistor of each of the first through m-th inverters I1 through Im are turned on for a predetermined amount of time and are thus uniformly stressed. Therefore, in the present embodiment, it is possible to properly perform a static burn-in test.

Here, the second and third control signals TS2 and TS3 are generated through the MRS and may have the same logic level. Or, alternatively, the second and third control signals TS2 and TS3 may be controlled separately from each other through the MRS. During the burn-in test mode, only one of the second and third control signals TS2 and TS3 can be generated, in this embodiment.

A semiconductor integrated circuit according to another exemplary embodiment of the present invention includes an I/O circuit and a test unit which, in a test mode, blocks an operation signal applied to the I/O circuit, applies a first signal to the I/O circuit for a predetermined amount of time, and applies a second signal to the I/O circuit for another predetermined amount of time. The test unit may include the transmission control unit 320 and the test control unit 330 of FIG. 3. The structures and operations of the transmission control unit 320 and the test control unit 330 have already been described in detail, and thus detailed descriptions thereof will be omitted.

A method of burn-in-testing a semiconductor integrated circuit including an I/O circuit according to an exemplary embodiment of the present invention includes: maintaining the voltages of a plurality of nodes of the I/O circuit at a high level or a low level and then switching the voltages of the nodes in a test mode to the opposite level. Here, the test mode is a package burn-in test mode. In the burn-in test method, the nodes of the I/O circuit can be burn-in-tested in two different voltage levels, and thus, stress can be uniformly applied to all elements of the I/O circuit. The burn-in test method can be implemented within the semiconductor integrated circuit 300 of FIG. 3, and thus a detailed description thereof will be omitted.

As described above, according to the present disclosure, it is possible to properly perform a static burn-in test by uniformly applying stress to all elements of a semiconductor integrated circuit in a burn-in test mode.

While the present invention has been particularly shown and described with reference to exemplary embodiments thereof, it will be understood by those of ordinary skill in the art that various changes in form and details may be made therein without departing from the spirit and scope of the present invention as defined by the following claims. It is intended, therefore, by the following claims to claim that which is literally described and all equivalents thereto, including all modifications and variations that fall within the scope of each claim.

What is claimed is:

1. A semiconductor integrated circuit (IC) comprising:
   a transmission control unit configured to output an operation signal if the semiconductor IC is in a normal operating mode and to block output of the operation signal if the semiconductor IC is in a test mode;
   a test control unit operatively coupled to the transmission control unit and configured to alternately output a first signal and a second signal in the test mode, the first signal and second signals having opposite levels, wherein the test control unit includes a first transistor coupled between a first voltage and a control node and is configured to generate the first signal in response to a control signal; and
   an input/output (I/O) circuit operatively coupled to the test control unit and configured to receive the first and second signals in the test mode.

2. The semiconductor integrated circuit of claim 1, wherein the first signal and second signal are output sequentially.

3. The semiconductor integrated circuit of claim 1, wherein the test control unit generates the first signal for a predetermined amount of time during the test mode and generates the second signal during the remainder of the test mode.

4. The semiconductor integrated circuit of claim 1, wherein the test control unit control node is configured to receive the operation signal from the transmission control unit in the normal operating mode and configured to output the first and second signals to the I/O circuit in the test mode.

5. The semiconductor integrated circuit of claim 1, wherein the semiconductor IC is disposed in a package and the test mode is a package burn-in test mode.

6. The semiconductor integrated circuit of claim 1, wherein the I/O circuit is a delay locked loop (DLL).

7. The semiconductor integrated circuit of claim 1, wherein the first signal is a high level signal and the second signal is a low level signal.

8. A semiconductor integrated circuit comprising:
   a transmission control unit configured to output an operation signal if the semiconductor IC is in a normal operating mode and to block output of the operation signal if the semiconductor IC is in a test mode, wherein the transmission control unit comprises a transmission gate configured to be turned on and to transmit the operation signal in response to a first control signal in the normal operating mode and to be turned off and to block the output of the operation signal in the test mode;
   a test control unit operatively coupled to the transmission control unit and configured to output a first signal and a second signal in the test mode, wherein the test control unit includes a control node configured to receive the operation signal from the transmission control unit in the normal operating mode and configured to output the first and second signals to an I/O circuit in the test mode, wherein the test control unit includes a first transistor coupled between a first voltage and the control node and is configured to generate the first signal in response to a second control signal; and
   the input/output (I/O) circuit operatively coupled to the test control unit and configured to receive the first and second signals in the test mode.

9. The semiconductor integrated circuit of claim 8, wherein the first control signal is generated through a mode register set (MRS).

10. A semiconductor integrated circuit comprising:
    a transmission control unit configured to output an operation signal if the semiconductor IC is in a normal operating mode and to block output of the operation signal if the semiconductor IC is in a test mode;
    a test control unit operatively coupled to the transmission control unit and configured to output a first signal and a second signal in the test mode, wherein the test control unit includes a control node configured to receive the operation signal from the transmission control unit in the normal operating mode and configured to output the first and second signals to an I/O circuit in the test mode, wherein the test control unit further comprises:
       a first transistor coupled between a first voltage and the control node and configured to generate the first signal in response to a second control signal; and
       a second transistor coupled between the control node and a second voltage and configured to generate the second signal in response to a third control signal, wherein, in the test mode, the first and second transistors are alternately turned on; and
    the input/output (I/O) circuit operatively coupled to the test control unit and configured to receive the first and second signals in the test mode.

11. The semiconductor integrated circuit of claim 10, wherein the second and third control signals are generated through a mode register set (MRS), the first voltage is a power supply voltage, and the second voltage is a ground voltage.

12. A semiconductor integrated circuit comprising:
    an I/O circuit including a set of elements to be tested; and
    a test control unit operatively coupled to the I/O circuit and, when in a test mode, configured to block an operation signal directed to the I/O circuit, to alternately apply a first signal to the I/O circuit for a predetermined amount of time, and a second signal to the I/O circuit, wherein the test control unit includes a first transistor coupled between a first voltage and a control node and is configured to generate the first signal in response to a control signal.

13. The semiconductor integrated circuit of claim 12, wherein the first and second signals have opposite levels.

14. The semiconductor integrated circuit of claim 13, wherein the first signal is a high level signal and the second signal is a low level signal.

15. The semiconductor integrated circuit of claim 12, wherein the test mode is a package burn-in test mode.

16. The semiconductor integrated circuit of claim 12, wherein the I/O circuit is a DLL.

17. A semiconductor integrated circuit, comprising:

an I/O circuit including a set of elements to be tested; and a test control unit operatively coupled to the I/O circuit and, when in a test mode, configured to block an operation signal directed to the I/O circuit, to apply a first signal to the I/O circuit for a predetermined amount of time, and to apply a second signal to the I/O circuit, wherein the test control unit comprises:

a transmission gate which controls the transmission of the operation signal in response to a first control signal;

a first transistor coupled between a first voltage and the I/O circuit and configured to transmit the first signal to the I/O circuit in response to a second control signal; and a second transistor coupled between a second voltage and the I/O circuit and configured to transmit the second signal to the I/O circuit in response to a third control signal.

18. The semiconductor integrated circuit of claim 17, wherein the first, second, and third control signals are generated through a mode register set (MRS).

* * * * *